US 6,531,408 B2

(12) United States Patent
Iwata et al.

(10) Patent No.: US 6,531,408 B2
(45) Date of Patent: Mar. 11, 2003

(54) METHOD FOR GROWING ZNO BASED OXIDE SEMICONDUCTOR LAYER AND METHOD FOR MANUFACTURING SEMICONDUCTOR LIGHT EMITTING DEVICE USING THE SAME

(75) Inventors: Kakuya Iwata, Tsukuba (JP); Paul Fons, Tsukuba (JP); Akimasa Yamada, Ibaraki (JP); Koji Matsubara, Tsukuba (JP); Shigeru Niki, Tsukuba (JP); Ken Nakahara, Kyoto (JP)

(73) Assignees: National Institute of Advanced Industrial Science and Technology, Tokyo (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/939,720

(22) Filed: Aug. 28, 2001

(65) Prior Publication Data

US 2002/0025594 A1 Feb. 28, 2002

(30) Foreign Application Priority Data

Aug. 28, 2000 (JP) ........................................ 2000-256727

(51) Int. Cl.$^7$ ......................... H01L 21/31; H01L 21/469
(52) U.S. Cl. ..................... 438/758; 438/492; 438/493; 438/478; 438/22; 257/79; 372/43
(58) Field of Search .......................... 438/758, 22, 478, 438/308, 492–93; 257/9–10, 79–88; 372/43

(56) References Cited

U.S. PATENT DOCUMENTS

| | | | | |
|---|---|---|---|---|
| 4,008,090 A | * | 2/1977 | Miyake et al. ................. | 106/43 |
| 4,564,509 A | * | 1/1986 | Shealy et al. ............ | 423/210.5 |
| 4,676,992 A | * | 6/1987 | Letellier ......................... | 427/9 |
| 5,670,798 A | * | 9/1997 | Schetzina .................... | 257/96 |
| 5,751,034 A | * | 5/1998 | Cuchiaro et al. ........... | 257/295 |

(List continued on next page.)

FOREIGN PATENT DOCUMENTS

| | | | | |
|---|---|---|---|---|
| DE | 19932201 | * | 7/1999 | ........... H01L/33/00 |
| JP | 5-194097 | * | 8/1993 | ........... C30B/29/22 |

OTHER PUBLICATIONS

V. Gupta et al. "Influence of interstitial oxygen on the c–axis orientation of sputter e–beam evaporated ZnO thin films" Applications of Ferrelectrics 1998 pp. 325–328.*

(List continued on next page.)

Primary Examiner—Matthew Smith
Assistant Examiner—Granvill D Lee
(74) Attorney, Agent, or Firm—Arent Fox Kintner Plotkin & Kahn, PLLC

(57) ABSTRACT

A substrate such as a sapphire substrate or the like is set to a molecular beam epitaxy (MBE) apparatus. Next, the temperature of the substrate is elevated to the temperature which is lower than the temperature at which a predetermined ZnO based oxide semiconductor layer (i.e. function layer) is grown (S1). Then, raw materials containing oxygen radical is irradiated to the substrate to grow a buffer layer made of ZnO based oxide semiconductor (S2). Subsequently, the irradiation of oxygen radical is stopped so as to eliminate the influence of oxygen onto the buffer layer (S3). Then, the temperature of the substrate is elevated to the temperature at which the predetermined ZnO based oxide semiconductor layer is grown (S4). After that, raw materials containing oxygen radical is irradiated so as to sequentially grow a ZnO based oxide semiconductor layer as a function layer (S5). As a result, a ZnO based oxide semiconductor layer with low concentration of residual carrier can be grown, and a semiconductor light emitting device such as light emitting diode and laser diode with high light emitting characteristics can be obtained.

8 Claims, 3 Drawing Sheets

U.S. PATENT DOCUMENTS

| | | | | |
|---|---|---|---|---|
| 5,888,585 | A | * | 3/1999 | Cuchiaro et al. ......... 427/126.3 |
| 6,046,464 | A | * | 4/2000 | Schetzina .................... 257/96 |
| 6,057,561 | A | * | 5/2000 | Kawasaki et al. ............ 257/94 |
| 6,232,252 | B1 | * | 5/2001 | Kim et al. ................. 501/97.2 |
| 6,416,888 | B1 | * | 7/2002 | Kawamura et al. ......... 428/690 |
| 2002/0014631 | A1 | * | 2/2002 | Iwata et al. ................... 257/89 |
| 2002/0042157 | A1 | * | 4/2002 | Kikawa et al. ............... 438/29 |
| 2002/0058351 | A1 | * | 5/2002 | Iwata et al. ................... 438/46 |
| 2002/0062858 | A1 | * | 5/2002 | Mowles ..................... 136/252 |
| 2002/0084455 | A1 | * | 7/2002 | Cheung ....................... 257/43 |

OTHER PUBLICATIONS

W. Wenas et al. "High growth rate transparent conducting zinc–oxide thin film prepared by metalorganic chemical vapor deposition technique for device applications" Optoelectronic and microelectronic materials devices 1998 p. 322–324.*

* cited by examiner

METHOD FOR GROWING ZNO BASED OXIDE SEMICONDUCTOR LAYER AND METHOD FOR MANUFACTURING SEMICONDUCTOR LIGHT EMITTING DEVICE USING THE SAME

FIELD OF THE INVENTION

The present invention relates to a method for growing a ZnO based oxide semiconductor layer, and a method for manufacturing a semiconductor light emitting device using the same. More specifically, the present invention relates to a method for growing a ZnO based oxide semiconductor layer in which the ZnO based oxide layer grown has the excellent flatness and has little crystal defects.

BACKGROUND OF THE INVENTION

Recently, it has become possible to obtain a light emitting diode (hereinafter, referred to as LED) in blue-based color (which means the wavelength range from ultraviolet to yellow, herein after, indicating the same meaning) used for a full-color display and a signal light, and a blue-based color laser for use in next-generation high-definition DVD light source which continuously emits light at room temperature (hereinafter, referred to as an LD), by depositing GaN based compound semiconductor layers onto a sapphire substrate, and there is a growing interest in them. As light emitting devices with short wavelength such as described above, GaN based compound semiconductor is in the mainstream. Besides the GaN based compound semiconductor, the use of, for example, Groups II–VI compound semiconductor such as ZnSe/ZnMgSSe based or ZnO based compound semiconductor has been studied.

A ZnO based oxide has been conventionally utilized only in the form of amorphous and polycrystalline. In recent years, however, plasma technology for making a gas such as nitrogen into plasma has been advanced. Accordingly, the thin film crystal growth technology where the above-mentioned plasma technology is applied using a radical source molecular beam epitaxy (RS-MBE) apparatus has made significant advancement. Moreover, studies on ZnO single crystal have been proceeded by employing PLD and a vapor phase transporting method, and have reached to the level at which the laser oscillation can be observed by a laser beam excitation (see Solid Stat. Commun., by P. Yu et al., vol. 103, No. 8 issue, on pages 459 to 466, in 1977, or Appl. Phys. Lett., by D. M. Bagnall et al, vol. 170, No. 17 issue, on pages 2230 to 2232, in 1977).

As described above, studies on ZnO based oxide semiconductor have made advancement. However, ZnO based oxide semiconductor has disadvantage in that, as compared with GaN, ZnO has high concentration of residual carriers, and the value thereof reaches to $10^{18}$ $cm^{-3}$ of n-type. The simplest method for lowering the concentration of the residual carriers is to elevate the high growth temperature. However, the present inventors have confirmed that, if simply elevating the growth temperature on the substrate, Zn which has reached on the substrate revaporizes from the surface of the substrate at high rate, and the growth does not proceed. This is because the deposition coefficient of ZnO onto the sapphire substrate having the different characteristics from ZnO is small, and in the case of ZnO, the vapor pressure of Zn is high (for example, see The 8th SiC and related wide gap semiconductor workshop P-83, or The 47th Applied Physics related association party, articles for lecture, 29a-YL-3). For the above reason, the growth temperature on the substrate is set to as low as at approximately 300° C. in many cases. However, at a low growth temperature, the concentration of the residual carries cannot be lowered, and the low concentration of the residual carriers, which is an essential condition for a semiconductor material, is not be attained.

Thus, it is considerable that a ZnO based oxide layer is once grown as a buffer layer at a low temperature, and after that, the temperature is elevated to high value at which an predetermined ZnO based oxide semiconductor layer such as a light emitting layer forming portion is grown. However, even in this method, the flatness of the buffer layer is degraded during elevating the temperature on the substrate. In this case, the ZnO based oxide semiconductor layer which constitutes the light emitting layer forming section has poor flatness accordingly, making it impossible to obtain improved light emitting characteristics.

SUMMARY OF THE INVENTION

The present invention has been made to solve the problems such as described above, and an object thereof is to provide a method for growing a ZnO based oxide semiconductor layer with excellent crystallinity and low concentration of residual carriers.

Another object of the present invention is to provide a method for manufacturing a semiconductor light emitting device with excellent light emitting characteristics such as a light emitting diode with excellent light emitting efficiency and a laser diode with low threshold current value by growing a ZnO based oxide semiconductor layer with excellent crystallinity.

The prevent inventors have conducted intensive studies to attain the growth of ZnO based oxide semiconductor layer without crystal defects, and with low concentration of residual carries. As a result of the studies, it was found out that the crystal defects and high concentration of the residual carries are resulted from the roughness on a surface of the growing ZnO based oxide semiconductor layer.

Specifically, as described above, if it is attempted to grow ZnO directly on a sapphire substrate at high temperature, ZnO is not sufficiently deposited onto the surface of the sapphire substrate, because the sapphire substrate has the different characteristics from those of ZnO. In addition, the vapor pressure of Zn is high. As a result, the growth of ZnO onto the sapphire substrate does not proceed, and the surface of the substrate becomes rough. The ZnO based oxide semiconductor layer which is grown thereon also has a rough surface resulted from the roughness of the surface of the substrate, and accordingly, has poor crystallinity. Even if the buffer layer is formed at a temperature as low as approximately 300° C., and then, the temperature is elevated to approximately 600° C. and an predetermined ZnO based oxide semiconductor layer is grown, thus-formed ZnO based oxide semiconductor layer still has poor flatness. It is also impossible to obtain a semiconductor layer with excellent crystallinity.

The present inventors have made intensive studies on the reason why excellent flatness cannot be attained even if a buffer layer is formed at a low temperature, and then, the temperature of the substrate is elevated to high temperature and an predetermined ZnO based oxide semiconductor layer is grown thereon. As a result of the studies, it was found the following. At the time when the temperature of the substrate is elevated to high temperature after the buffer layer is deposited, if the temperature is elevated in the state of supplying oxygen as is the case of a conventional material gas of Group V elements such as GaAs and GaN, etching effect occurs by the supplied oxygen during the elevation of the temperature. As a result, the flatness of the surface of the buffer layer is degraded, and the roughness is formed thereon.

Due to the roughness on the surface of the buffer layer, an predetermined ZnO based oxide semiconductor layer which is grown thereon at high temperature also has roughness because of the roughness of the buffer layer, and has poor crystallinity. To overcome this problem, the present inventors have reached the following finding. In the temperature elevating step, the supply of oxygen is stopped to eliminate the influence of oxygen. Then, the temperature of the substrate is elevated to a predetermined temperature and a necessary raw materials such as plasma oxygen and Zn is irradiated onto the buffer layer. In this manner, a semiconductor layer with excellent crystallinity can be obtained.

According to the present invention, a method for growing a ZnO based semiconductor layer includes the steps of: supplying raw materials containing oxygen onto a substrate at a temperature lower than a temperature at which a function layer made of a predetermined ZnO based oxide semiconductor is grown, so as to grow a buffer layer made of ZnO based oxide semiconductor; stopping the irradiation of the oxygen plasma and then elevating the temperature of the substrate to the temperature at which the function layer is grown; growing the function layer by supplying raw materials containing oxygen.

Here, ZnO based compound semiconductor means an oxide containing Zn. Specific examples thereof include ZnO, oxides of Group IIA and Zn, oxides of Group IIB and Zn, or oxides of Group IIA and Group IIB and Zn.

By use of the method of the present invention, a ZnO based oxide semiconductor layer is grown as a buffer layer at low temperature. In this manner, whereas the buffer layer itself has high concentration of residual carriers, this semiconductor layer has highly flat surface. Then, a predetermined ZnO based oxide semiconductor layer is grown thereon. Since the influence of oxygen is eliminated at the time when the temperature of the substrate is elevated, the temperature of the substrate can be elevated to at approximately 600° C. while flatness of the surface of the substrate is maintained. In this state, since the raw materials such as oxygen and Zn are supplied to the surface of the substrate, the predetermined ZnO based oxide semiconductor layer is grown on the flat buffer layer. As a result, the ZnO based oxide layer growing on the flat surface grows along the flat surface and crystals of the buffer layer, thereby obtaining a ZnO based oxide semiconductor layer with very little crystal defects.

In particular, by growing the buffer layer under the condition of Zn rich, it is obtained to flatten the surface of the buffer layer and unitize polarity. Accordingly, the crystallity of the ZnO based oxide semiconductor layer growing thereon at high temperature has further improved.

Here, the condition where Zn is rich has the following meaning. In the relationship between the growth rate (shown by a longitudinal axis) and the supply amount of Zn (shown by a horizontal axis) shown in FIG. 3 for example, the supply amount of Zn (shown by a horizontal axis) is changed in the state where the supply amount of oxygen (O) is kept at constant value. The condition where Zn is rich is the growth condition where the supply amount of Zn is larger than the shoulder portion of the graph of FIG. 3 (the portion where the growth rate is saturated), and shows the relationship between the supply amount and the growth rate on the surface of the substrate at the time of growth.

In the relationship between the growth rate and the supply amount of Zn shown in FIG. 3, the shoulder portion of the graph shifts toward left side by lowering the growth temperature. Therefore, even if the supply amount of Zn is the same, by lowering the growth temperature, the condition where Zn is rich is easily attained. In the case of a MgZnO or CdZnO semiconductor layer where a portion of Zn is substituted by other elements such as Mg, the relationship means that the total supply amount of these elements is larger than the aforementioned portion where the growth rate is saturated.

A method for manufacturing a semiconductor light emitting device according to a specific example of the present invention includes the steps of; (a) growing a buffer layer made of ZnO based oxide semiconductor on the surface of the substrate at a temperature lower than the temperature at which a light emitting layer forming section made of a predetermined ZnO based oxide semiconductor is grown by employing MBE method, while irradiating raw materials containing oxygen radical on the surface of a substrate; (b) stopping the irradiation of the oxygen radical, and then, elevating the temperature of the substrate to the temperature at which a predetermined ZnO based oxide semiconductor layer constituting the light emitting layer forming saction is grown; and (c) sequentially growing semiconductor layers constituting the light emitting layer forming section, while irradiating the raw materials including the oxygen radical on the surface of said substrate.

DETAILED DESCRIPTION OF THE INVENTION

Figure 1:
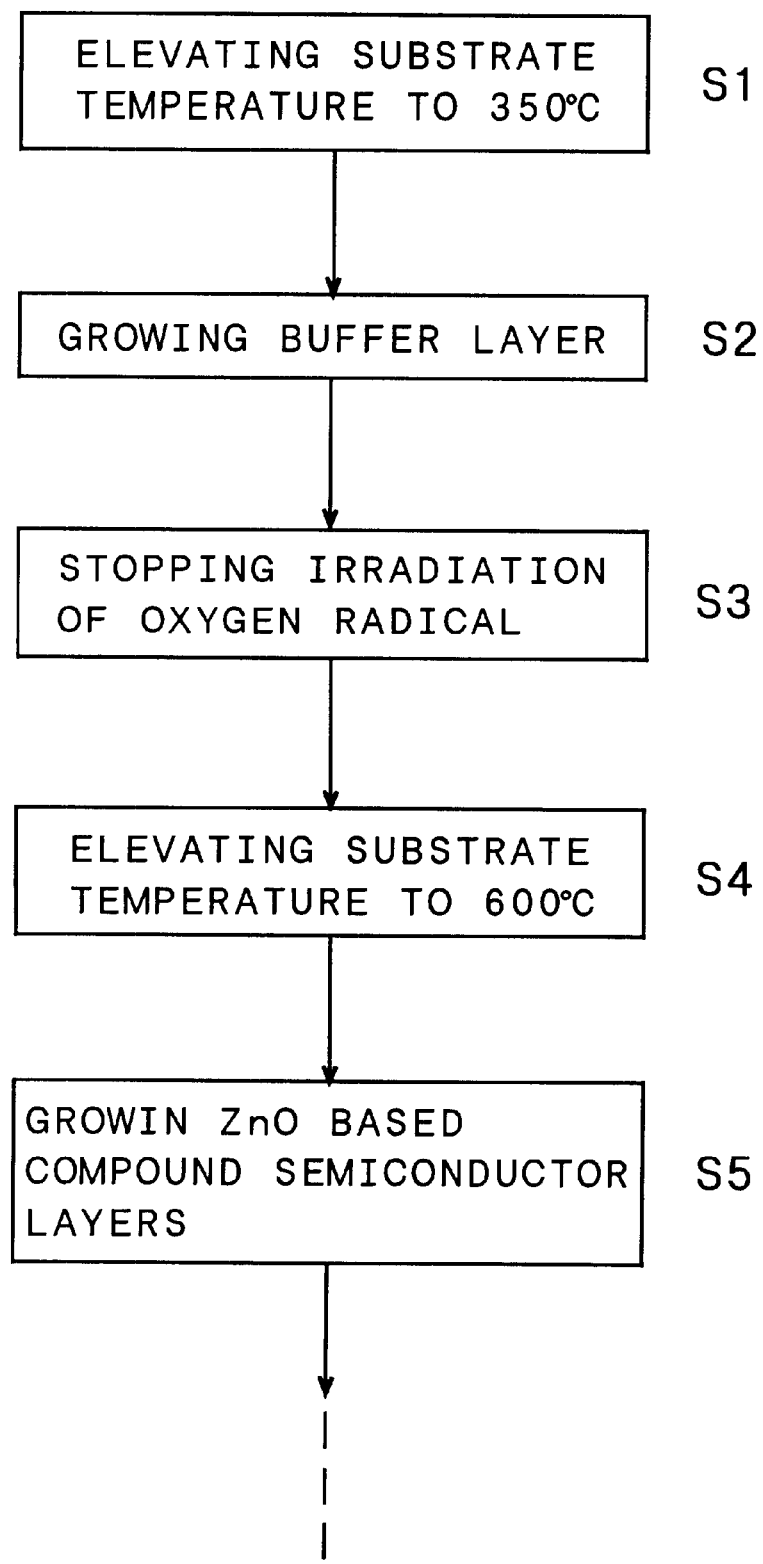
FIG. 1 is a flow chart of exemplary steps of growing a ZnO based oxide semiconductor layer according to the present invention.

Hereinafter, a method for growing a ZnO based oxide semiconductor layer according to the present invention will be described with reference to drawings. As shown in the flow chart of FIG. 1, a method for growing a ZnO based oxide semiconductor layer includes the following steps, for example.

First, a substrate such as a sapphire substrate or the like is set to a molecular beam epitaxy (MBE) apparatus. Next, the temperature of the substrate is elevated to 600 to 700° C. and the substrate is subjected to thermal cleaning at this temperature. After that, the temperature of the substrate is lowered to the temperature which is lower than the temperature at which the predetermined ZnO based oxide semiconductor layer (i.e. function layer) is grown, specifically, is lowered to about 300 to 400° C., for example, to about 350° C. (S1). Then, raw materials containing oxygen radical are irradiated to the substrate to grow a buffer layer constituted by ZnO based oxide semiconductor (S2). Subsequently, the irradiation of oxygen radical is stopped so as to eliminate the influence of oxygen onto the buffer layer (S3). Then, the temperature of the substrate is elevated to the temperature at which the ZnO based oxide semiconductor as the function layer is grown, specifically, is elevated to about 600° C. (S4). After that, raw materials containing oxygen radical are irradiated so as to sequentially grow ZnO based oxide semiconductor (S5).

Figure 2:
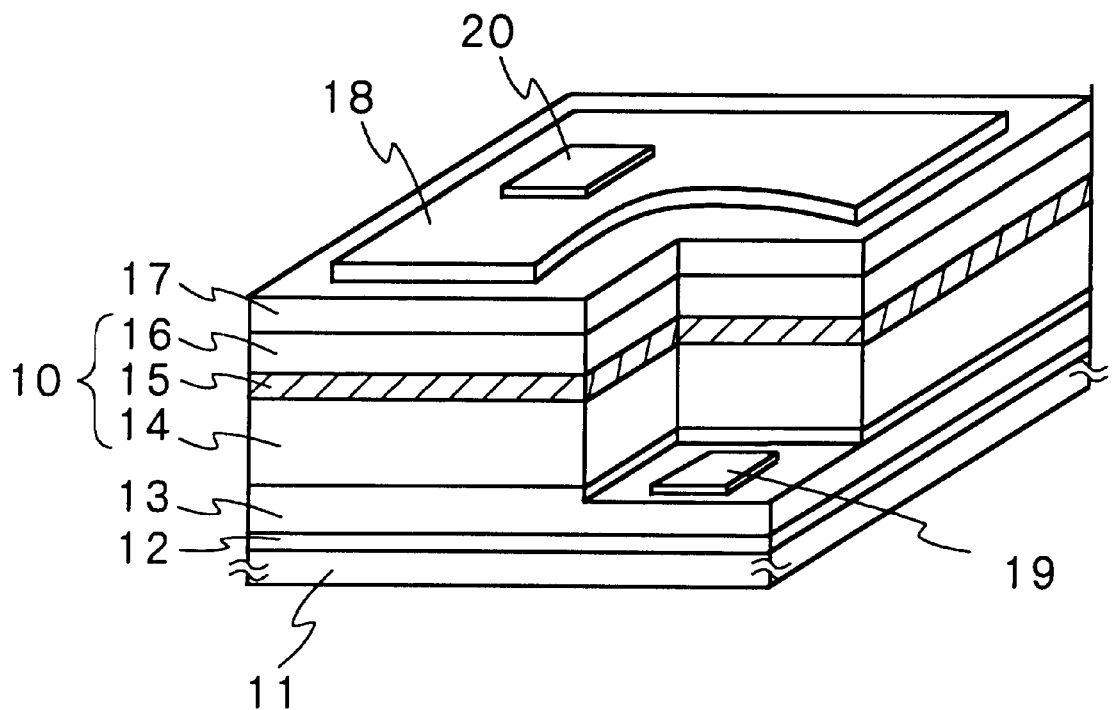
FIG. 2 is a structural drawing of an LED chip manufactured according to an embodiment of the present invention.

Specifically, the method for growing ZnO based oxide semiconductor layer of the present invention is characterized by the following steps: a ZnO based oxide semiconductor layer is grown on the substrate at low temperature (for example, 300 to 400° C.); when the temperature of the substrate is elevated to high temperature to grow a predetermined ZnO based oxide semiconductor layer, while the influence of the oxide radical onto the grown buffer layer is eliminated, the temperature is elevated to 500° C. or higher at which the predetermined ZnO based oxide semiconductor layer is grown, for example, about 600° C.; and raw materials such as oxide radical and Zn for growing predetermined ZnO based oxide semiconductor layer is irradiated so as to grow a semiconductor layer. The temperature at which the predetermined ZnO based oxide semiconductor layer is grown is the temperature at which, in the case of forming a semiconductor light emitting device such as shown in FIG. 2 for example, MgZnO of a clad layer or CdZnO of an active layer which constitute a light emitting layer forming section 10 are grown, for example within the range between 550 to 650° C.

The reason why the buffer layer is grown at a temperature as low as 300 to 400° C. is as follows. As has been described above, if the buffer layer is directly grown on a sapphire substrate at high temperature which has different characteristics from those of ZnO based oxide semiconductor, the resultant buffer layer does not have a flat surface and is a rough layer, due to the poor deposition of the ZnO onto the surface of the substrate, and high vapor pressure of Zn. The ZnO based oxide semiconductor layer grown thereon also has crystal defects resulted from the roughness of the buffer layer. Contrary to this, by growing the buffer layer at low temperature, a ZnO based oxide semiconductor layer with flat surface is easily obtained. As a result of intensive studies, the present inventors have found out that a layer with further flat surface can be obtained by growing the layer in a condition where Zn is rich.

Figure 3:
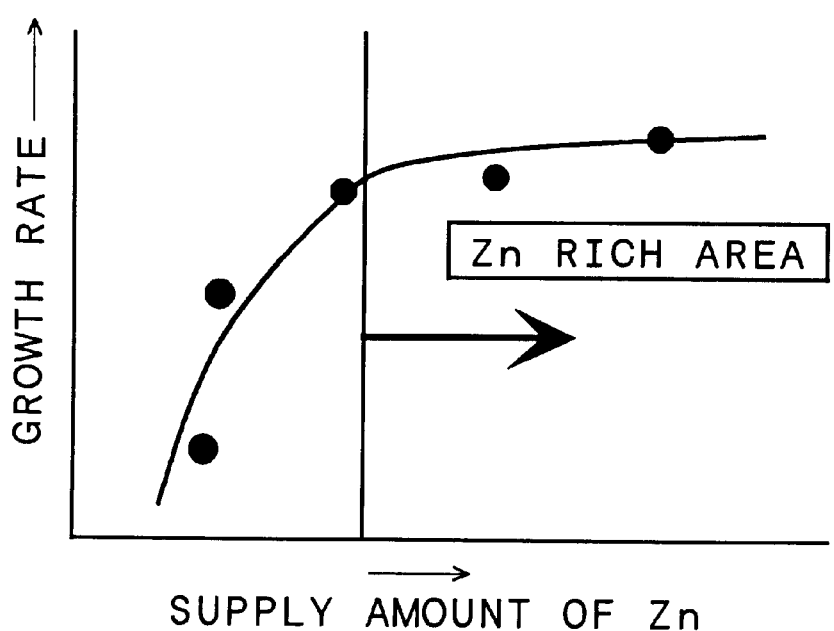
FIG. 3 is an illustrative diagram showing a relationship of a growth rate with respect to a supply amount of Zn, for illustrating the meaning of the condition where Zn is rich.

As has been described above, the condition where Zn is rich has the following meaning. In the relationship between the growth rate (shown by a longitudinal axis) and the supply amount of Zn (shown by a horizontal axis) shown in FIG. 3 for example, the supply amount of Zn (shown by a horizontal axis) is changed in the state where the supply amount of oxygen (O) is kept at constant value. The condition where Zn is rich is the growth condition where the supply amount of Zn is larger than the shoulder portion of the graph of FIG. 3 (the portion where the growth rate is saturated). Even if the supply amount of Zn is the same, by lowering the growth temperature, the condition where Zn is rich is easily attained. This phenomenon corresponds to the fact that, when the aforementioned growth temperature is high, Zn on the surface of the substrate easily vaporizes and Zn is easily rid of the substrate. For this reason, by growing the buffer layer at low temperature, it is easy to obtain a ZnO based oxide semiconductor layer with flat surface. In this case, if the supply amount of Zn is increased to produce a condition where Zn is rich as far as the condition of device permits, it is possible to obtain a buffer layer with flat surface, even if it has been grown at relatively high temperature.

When a semiconductor light emitting device is formed, its light emitting efficiency becomes high if the light emitting layer forming section in which an active layer is interposed between n-type and p-type clad layers, and especially the active layer have little crystal defects. Therefore, the oxide semiconductor layer with good crystallinity is required. For this reason, the growth at high temperature is essential, and the crystal growth is performed at temperature as high as about 600° C. In this temperature elevating step, conventionally, after a buffer layer is grown, the temperature of the substrate is elevated in an oxygen radical atmosphere based on the same concept as that applied to the growth of the other compound semiconductor.

As has been described above, the oxygen has an etching effect, and roughens the flatly formed surface of the buffer layer. The roughened surface, in turn, has an adverse effect on the growth of the ZnO based oxide semiconductor layer at high temperature.

Contrary to the above, in the present invention, when the growth of the buffer layer is finished and the shutters of the crucibles or the like of material sources are closed, a shutter of oxygen radical cell is also closed. In addition, the substrate is turned away from the oxygen radical cell. In this manner, the influence of oxygen onto the substrate is eliminated. Then, the temperature of the substrate is elevated. The growth of each semiconductor layer performed thereafter is proceeded in the same manner as of the conventional cases where raw materials corresponding to an oxide semiconductor layer with a required composition is irradiated so as to grow a ZnO based oxide semiconductor layer.

Figure 4:
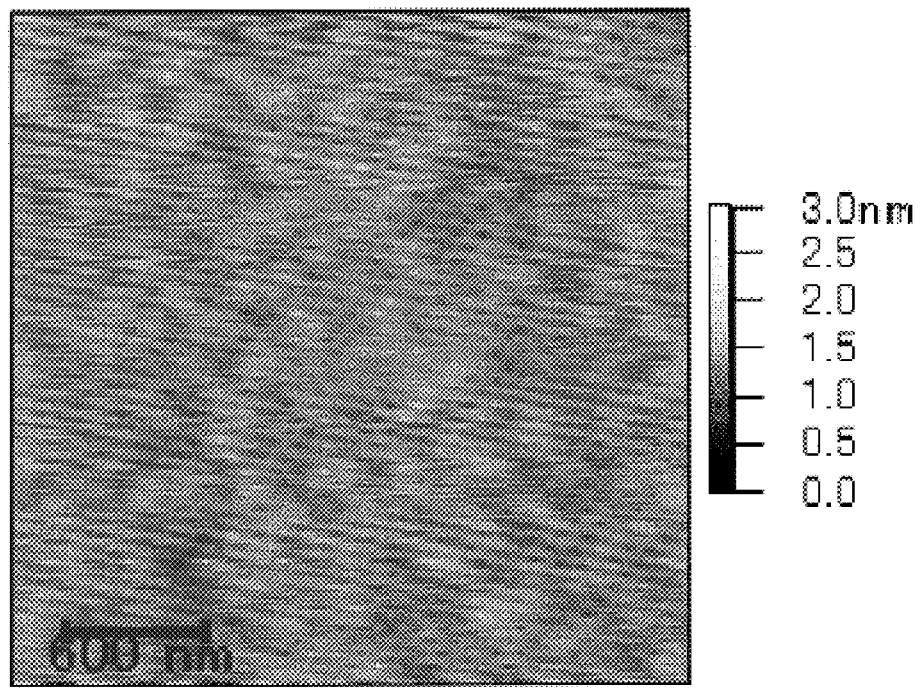
FIGS. 4(a) to 4(b) are AFM images in tapping mode respectively showing a surface state of the ZnO based oxide semiconductor layer grown according to the present invention, and a surface state of that grown according to a conventional method, in order to make a comparison therebetween.
Figure 4:
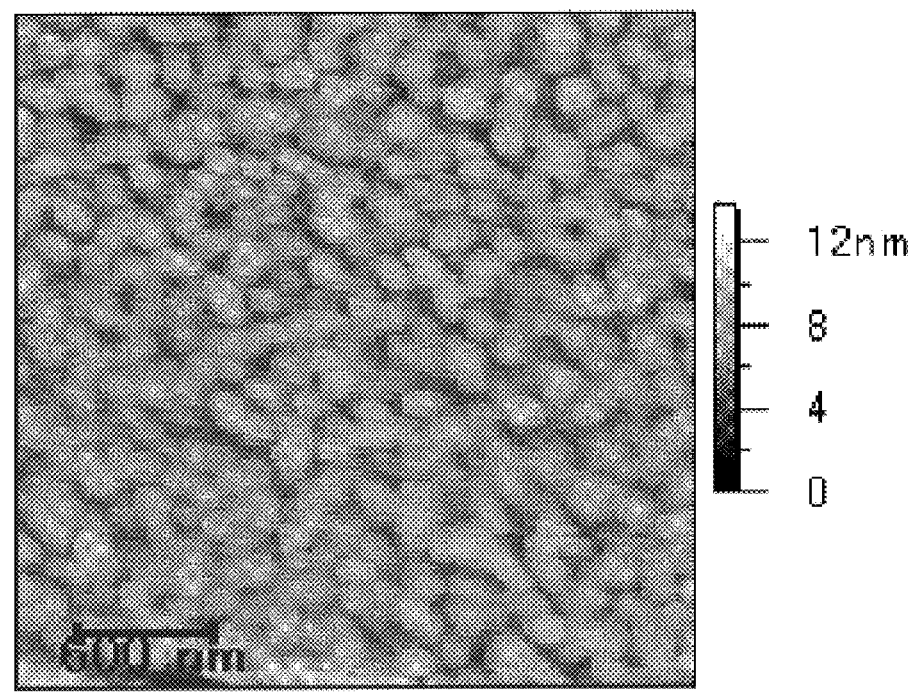

A ZnO semiconductor layer is formed on the buffer layer by employing the above method, and its surface state is observed through an AFM image in a tapping mode. As shown in FIG. 4(a), the difference in heights (i.e. shown by a contrast, and is the difference in heights between white-colored portions (surface side) and black-colored portions (depressed portions)) is about 3 nm, and its RMS is as very small as 0.27 nm. Contrary to this, when a ZnO semiconductor based oxide layer is grown by employing a conventional method where the temperature of the substrate is elevated while the oxygen radical is irradiated, its surface state is observed through an AFM image under the same conditions as of the above. As shown in FIG. 4(b), the difference in heights is 12 nm and the roughness is obviously different from the case shown in FIG. 4(a). The RMS is 1.44 nm. In FIG. 4(a), the portions shaded with stripes are portions where a noise at the time of tapping appears because the difference in heights in these portions is small.

Next, a method for manufacturing a semiconductor light emitting device shown in FIG. 2 will be described. FIG. 2 shows an exemplary LED chip in blue-based color (with wavelength from ultraviolet to yellow) which uses ZnO based compound semiconductor.

The steps of manufacturing the LED is as follows. First, a sapphire substrate 11 is set into a MBE apparatus for example. The temperature of the surface of the substrate is measured by a radiation thermometer, and is set to about 350° C. Zn and oxygen are irradiated to induce a condition where Zn is rich. In this state, a buffer layer 12 made of ZnO with flat surface is formed into a thickness of about 50 nm to 0.1 $\mu$m. Then, while the influence of the oxygen is eliminated, the temperature of the substrate is elevated to about 600° C.

At the time when the temperature of the substrate reaches about 600° C., the shutters of material sources (cells) of oxygen radical and zn are opened so as to irradiate oxygen radical and Zn again. At the same time, the shutter of the source of Al or Ga, which is n-type dopant, is also opened to grow a n-type contact layer 13 made of n-type ZnO into the thickness of about 1.5 $\mu$m. Then, the shutter of the source of Mg is also opened to grow a n-type clad layer 14 made of $Mg_yZn_{1-y}O$ (where $0 \leq y < 1$, for example, y=0.15) into the thickness of about 2 $\mu$m. After that, the supply of Mg and n-type dopant are stopped, and the shutter of the source of Cd is opened to grow in an undoped state an active layer 15 made of $Cd_xZn_{1-x}O$ (where $0 \leq x < 1$, for example, x=0.08) into the thickness of about 0.1 $\mu$m. The supply of Cd is stopped, and the shutter of the source of Mg is opened again, and the shutter of plasma excitation nitrogen as p-type dopant, and the shutter of Al or Ga as a buffer agent are opened respectively to form a p-type clad layer 16 made of p-type $Mg_yZn_{1-y}O$ (where $0 \leq y < 1$, for example, y=0.15) into the thickness of about 2 $\mu$m.

Then, the supply of Mg is stopped and the growth is continued to sequentially grow a p-type contact layer 17 made of p-type ZnO into the thickness of about 1 $\mu$m. The n-type clad layer 14, the active layer 15, and the p-type clad layer 16 together constitute a light emitting layer forming section (i.e. a function layer) 10.

After that, a wafer on which the epitaxial layers are grown is removed from the MBE device, and then is set in a sputtering device to form an ITO film, which is a transparent conductive film, into the thickness of about 0.15 $\mu$m. Then, a portion of the deposited semiconductor layers is subjected to dry etching such as RIE method to expose the n-type contact layer 13. After that, the back surface of the sapphire substrate 11 is polished so that the thickness of the substrate 11 becomes about 100 $\mu$m. Through vacuum evaporation by lift off method and the like, on the ITO film 18, a p-side electrode 20 made of Ni/Al or the like is formed, and on the surface of the n-type contact layer 13 exposed by etching, an n-side electrode 19 made of Ti/Au or the like is formed, respectively. Then, the wafer is cut into chips to obtain LED chips such as shown in FIG. 2.

In the above embodiment, shown is an LED chip in which the light emitting layer forming section 10 is in a double-hetero junction. Alternatively, the light emitting layer forming section 10 may be in other junction structures such as a pn junction structure of hetero junction or homogeneous junction. Same thing as is the case of LED described above is applied to the LD.

In the case of LD, the active layer 15 is preferably constituted by multiple quantum well structure in which, for example, respective 2 to 5 barrier layers and well layers made of nondoped $Cd_{0.03}Zn_{0.97}O/Cd_{0.2}Zn_{0.8}O$ each into the thickness of 5 nm/4 nm are alternately accumulated. In the case where the active layer 15 has too thin thickness, and light cannot be encapsulated into the active layer 15, a light guiding layer made of ZnO for example is provided to each of the both surfaces of the active layer. A transparent electrode made of the ITO film 18 is unnecessary. The active layer 15 is formed into the structure where a current supplying region is defined by directly forming a p-side electrode 20 through patterning into the shape of stripe, or by etching the upper portion of the semiconductor layer into the shape of mesa, or by embedding a current narrowing layer.

According to the semiconductor light emitting device of the present invention, a ZnO based oxide semiconductor layer with excellent crystallinity can be formed, thereby obtaining an LED with high light emitting efficiency. In the case of LD, the threshold current value can be lowered, and the semiconductor light emitting device with improved light emitting characteristics can be obtained.

In each of the embodiments described above, the Zno based semiconductor layer is grown onto the sapphire substrate by MBE method. Alternative to this, MOCVD method is also employable as well. In this case, as is the case of the MBE method, after the buffer layer is formed, the temperature on the substrate is elevated in the state where the contact with oxygen is avoided. After the temperature on the substrate is elevated, a reaction gas containing oxygen is introduced. In this manner, a ZnO based oxide semiconductor layer with excellent cristallinity can be grown onto the flat buffer layer.

According to the present invention, the ZnO based oxide semiconductor layer can be grown with excellent crystallinity. Due to this advantage, in manufacturing a semiconductor light emitting element, the light emitting layer forming section has improved crystallinity, thereby obtaining a semiconductor light emitting device in blue-based color with high light emitting efficiency.

Although preferred examples have been described in some detail it is to be understood that certain changes can be made by those skilled in the art without departing from the spirit and scope of the invention as defined by the appended claims.

What is claimed is:

1. A method for growing a ZnO based semiconductor layer comprising the steps of:

supplying raw materials containing oxygen onto a substrate at a temperature lower than a temperature at which a function layer made of a predetermined ZnO based oxide semiconductor is grown, so as to grow a buffer layer made of ZnO based oxide semiconductor, stopping the supply of said oxygen and elevating the temperature of said substrate to a temperature at which said function layer is grown, and growing said function layer by supplying raw materials containing oxygen.

2. A method according to claim 1, wherein said buffer layer is grown in the condition where Zn is rich.

3. A method according to claim 1, wherein the temperature at which said buffer layer is grown is at 300 to 400° C., and the temperature at which said function layer is grown is at 500° C. or higher.

4. A method according to claim 3, wherein said temperature at which said function layer is grown is 550 to 650° C.

5. A method according to claim 1, wherein, at the time when the temperature of said substrate is elevated, the supply of said oxygen is stopped, and the surface of said substrate is turned away from the supplying source of said oxygen.

6. A method for manufacturing a semiconductor light emitting device comprising the steps of:

(a) growing a buffer layer made of ZnO based oxide semiconductor at a temperature lower than a temperature at which a light emitting layer forming section made of ZnO based oxide semiconductor is grown, while irradiating raw materials containing oxygen radical on a surface of a substrate by MBE method;

(b) stopping the irradiation of said oxygen radical, and then elevating the temperature of said substrate to a temperature at which a ZnO based oxide semiconductor layer constituting said light emitting layer forming section is grown; and (c) sequentially growing semiconductor layers which constitute said light emitting layer forming section, while irradiating raw materials containing oxygen radical on the surface of said substrate.

7. A method according to claim 6, wherein said buffer layer is grown in a condition where Zn is rich.

8. A method according to claim 6, wherein said light emitting layer forming section constitutes a light emitting diode or a laser diode.

* * * * *